US012218511B2

(12) United States Patent
Marquis

(10) Patent No.: US 12,218,511 B2
(45) Date of Patent: Feb. 4, 2025

(54) MONITORING SYSTEMS AND METHODS FOR POWER LINE STRUCTURES AND ENERGY HARVESTING

(71) Applicant: Steven Marquis, Fall City, WA (US)

(72) Inventor: Steven Marquis, Fall City, WA (US)

(*) Notice: Subject to any disclaimer, the term of this patent is extended or adjusted under 35 U.S.C. 154(b) by 113 days.

(21) Appl. No.: 17/697,875

(22) Filed: Mar. 17, 2022

(65) Prior Publication Data
US 2022/0302753 A1   Sep. 22, 2022

Related U.S. Application Data

(60) Provisional application No. 63/162,176, filed on Mar. 17, 2021.

(51) Int. Cl.
| | |
|---|---|
| G01R 31/08 | (2020.01) |
| G01K 1/024 | (2021.01) |
| H02G 3/08 | (2006.01) |
| H02J 50/00 | (2016.01) |

(52) U.S. Cl.
CPC ............ *H02J 50/001* (2020.01); *G01K 1/024* (2013.01); *G01R 31/085* (2013.01); *H02G 3/088* (2013.01)

(58) Field of Classification Search
CPC ...... G01R 31/085; H02J 50/001; H02G 3/088
See application file for complete search history.

(56) References Cited

U.S. PATENT DOCUMENTS

| | | | | |
|---|---|---|---|---|
| 5,181,026 A | * | 1/1993 | Granville | H02J 13/00002 |
| | | | | 324/96 |
| 6,142,434 A | * | 11/2000 | Trost | E04H 12/24 |
| | | | | 24/270 |
| 2003/0234653 A1 | * | 12/2003 | Kollenda | G01R 31/52 |
| | | | | 324/551 |
| 2008/0036617 A1 | | 2/2008 | Arms et al. | |

(Continued)

FOREIGN PATENT DOCUMENTS

WO    2014075140 A1    5/2014

OTHER PUBLICATIONS

Chang et al., "Electric Field Energy Harvesting Powered Wireless Sensors for Smart Grid", Journal of Electrical Engineering & Technology, 2012, pp. 75-80, vol. 7, No. 1.

(Continued)

*Primary Examiner* — Alesa Allgood
(74) *Attorney, Agent, or Firm* — Dentons Davis Brown; Matthew Warner-Blankenship

(57) ABSTRACT

A monitoring system for a power line structure includes a system for harvesting electrical energy from electric fields emanating from the power line. The monitoring system includes a weather resistant enclosure configured to be mounted near the power line. The electrical energy harvesting system includes an electric field antenna configured to receive electric fields emanating from the power line, an electrical energy harvesting circuit mounted within the enclosure and an earth ground connector configured to couple the harvesting circuit to an earth ground connection (Continued)

by direct connection or via a capacitive structure. An energy storage device is also electrically coupled to the harvesting circuit. The monitoring system further includes a sensor system electrically coupled to the harvesting system. The sensor system is configured to sense a condition and transmit corresponding condition data.

19 Claims, 7 Drawing Sheets

(56) References Cited

U.S. PATENT DOCUMENTS

| | | | |
|---|---|---|---|
| 2008/0077336 A1* | 3/2008 | Fernandes | H02J 13/00006 702/65 |
| 2014/0278150 A1 | 9/2014 | Baesler et al. | |
| 2014/0314122 A1 | 10/2014 | Knoop | |
| 2016/0313209 A1 | 10/2016 | Van Zee et al. | |
| 2017/0030956 A1 | 2/2017 | McCammon et al. | |
| 2018/0238955 A1* | 8/2018 | Bango | G08B 21/02 |

OTHER PUBLICATIONS

Chan et al., "Smart Utility Poles", Chancellors Honors Program Projects, 2014.
Crites et al., "Smart Utility Pole", pp. 1-7.
Gupta et al., "Energy harvesting from electromagnetic energy radiating from AC power lines", 2010.
Khan, Farid Ullah, "Energy Harvesting from the Stray Electromagnetic Field around the Electrical Power Cable for Smart Grid Applications", The Scientific World Journal, 2016, pp. 1-20, vol. 2016, Publisher: Hindawi Publishing Corporation.
Narayanan et al., "Deterring Attacks Against the Power Grid", 2020, Publisher: RAND Corporation, Published in: Santa Monica, Calif.
Priya et al., "Design of Wireless Networked Electricity Pole Line Multi-Fault Monitoring System", International Journal of Recent Technology and Engineering (IJRTE), 2019, pp. 321-324, vol. 8.
Scott et al., "Vibration Monitoring of Power Distribution Poles", 2006.
Snow, C., "Keeping the lights on: Utility pole monitoring made possible by Arm Mbed".

* cited by examiner

MONITORING SYSTEMS AND METHODS FOR POWER LINE STRUCTURES AND ENERGY HARVESTING

CROSS-REFERENCE TO RELATED APPLICATION(S)

This application claims priority to U.S. Provisional Application No. U.S. 63/162,176 filed Mar. 17, 2021, and entitled "Tower of Power; Power Pole Monitoring with Practical Energy Harvesting Means," which is hereby incorporated by reference in its entirety under 35 U.S.C. § 119(e).

TECHNICAL FIELD

The disclosure relates generally to sensing and monitoring for power line structures, and more particularly relates to systems, methods, and devices for providing operational power for such sensing and monitoring.

BACKGROUND

Providing low cost monitoring of power line and distribution structures, such as utility power poles, with reduced maintenance and installation challenges has long been desired. For example, there are a number of industry, government and university papers that anticipate a need for power pole monitoring for economic, uptime, and national security reasons.

A central design concern relates to conveniently and economically providing the electrical power to operate various sensing and communication devices. Industry and research efforts have involved, among other things, directly tapping power lines, employing inductive or magnetic field coupling/or and solar cells connected with rechargeable batteries, and resorting to disposable batteries with a limited lifetime. These attempted solutions have cost and installation challenges, and maintenance, reliability and size disadvantages that have kept them from being commercially realized at any scale of consequence. The result of these drawbacks is that there are no commercially available products for pole monitoring with significant market penetration.

SUMMARY

Aspects of this disclosure provide examples of innovative sensing and monitoring systems for power line structures. Various implementations of the disclosure include an energy harvester configured to harvest energy from stray electric fields emanating from a nearby power line.

A monitoring system for a power line structure is provided according to one aspect of the disclosure. The system includes a weather resistant enclosure configured to be mounted near to or on a power line structure, an electrical energy harvesting circuit mounted within the weather resistant enclosure, an electric field antenna electrically coupled to the harvesting circuit, the electric field antenna configured to receive electric fields emanating from a power line, an energy storage device mounted within the weather resistant enclosure and electrically coupled to the harvesting circuit, an earth ground connector configured to electrically or capacitively couple the harvesting circuit to earth ground, a controller mounted within the weather resistant enclosure and electrically coupled to the energy storage device, a radio mounted within the weather resistant enclosure and electrically coupled to the energy storage device and the controller, the radio configured to transmit data from the controller, and a radio antenna electrically coupled to the radio.

Various implementations of the monitoring system include one or more of the following features and/or elements. In some cases the weather resistant enclosure comprises an electrically conductive layer that forms at least part of the electric field antenna. In various cases the weather resistant enclosure comprises a metal or metallized enclosure. In some cases the weather resistant enclosure is electrically insulative and the electric field antenna is mounted within the weather resistant enclosure. In various cases the monitoring system further comprises an electrically conductive enclosure mounted within the weather resistant enclosure, wherein the electrical energy harvesting circuit, the energy storage device, the controller, and the radio system are mounted within the electrically conductive enclosure.

In various cases of the monitoring system, the earth ground connector is configured to electrically couple the harvesting circuit to a guy wire. In various cases the monitoring system further comprises a lightning arrestor electrically coupled between the electric field antenna and the earth ground connector. In various cases the electrical energy harvesting circuit comprises a rectifier electrically coupled with a voltage conversion stage. In various cases the controller is configured to detect one or more of arcing power lines and an electromagnetic pulse based on the electric fields received by the electric field antenna. In various cases the monitoring system of further comprises one or more sensors electrically coupled to the harvesting circuit and the controller, wherein the controller is configured to receive data from the one or more sensors, and wherein the controller is configured to detect power line conditions, detect temperature, detect movement of the power line structure, and/or capture an image based on the data from the one or more sensors. In various cases the monitoring system further comprises an emergency switch electrically coupled to and configured to open the earth ground connection, wherein the controller is configured to detect the open earth ground connection and transmit an emergency message to a remote monitoring station with the radio.

According to another aspect of the disclosure, a monitoring system for a power line structure is provided. The monitoring system comprises a weather resistant enclosure configured to be mounted near a power line, an electrical energy harvesting system, and a sensor system electrically coupled to the harvesting system.

In various implementations the electrical energy harvesting system comprises an electric field antenna configured to receive electric fields emanating from a power line, an electrical energy harvesting circuit mounted within the enclosure and electrically coupled to the electric field antenna, an earth ground connector configured to electrically couple the harvesting circuit to an earth ground connection by direct connection or via a capacitive structure, and an energy storage device electrically coupled to the harvesting circuit. In some cases the sensor system is configured to sense a condition and transmit corresponding condition data.

Various implementations of the monitoring system include one or more of the following features and/or elements. In some cases the sensor system comprises one or more sensors electrically coupled with a controller, and a radio and radio antenna electrically coupled with the controller. In various cases the controller is configured to detect one or more of arcing power lines and an electromagnetic pulse based on the electric fields received by the electric field antenna. In various cases the controller is configured to receive data from the one or more sensors, and the controller is configured to detect power line conditions, detect temperature, detect movement of the power line structure, and/or capture an image based on the data from the one or more sensors.

In various cases the electric field antenna comprises an electrically conductive layer of the weather resistant enclosure. In various cases the weather resistant enclosure comprises a metal or metallized enclosure. In various cases the weather resistant enclosure is electrically insulative and the electric field antenna is mounted within the weather resistant enclosure. In various cases the monitoring system further comprises an electrically conductive enclosure mounted within the weather resistant enclosure, wherein the electrical energy harvesting circuit and the energy storage device are mounted within the electrically conductive enclosure. In various cases A method for monitoring a condition near a power line structure is provided according to another aspect of the disclosure. The method includes receiving electric fields with an electric field antenna from a power line supported by a power line structure, generating electrical energy based on the received electric fields, storing the electrical energy in an energy storage device, providing electrical energy from the energy storage device to a controller, a radio system, and a sensor system, sensing a condition with the sensor system, and transmitting data corresponding to the sensed condition with the radio system.

While multiple implementations and aspects are disclosed, still other embodiments of the disclosure will become apparent to those skilled in the art from the following detailed description, which shows and describes illustrative embodiments of the disclosed apparatus, systems and methods. As will be realized, the disclosed apparatus, systems and methods are capable of modifications in various obvious aspects, all without departing from the spirit and scope of the disclosure. Accordingly, the drawings and detailed description are to be regarded as illustrative in nature and not restrictive.

DETAILED DESCRIPTION

Figure 1:
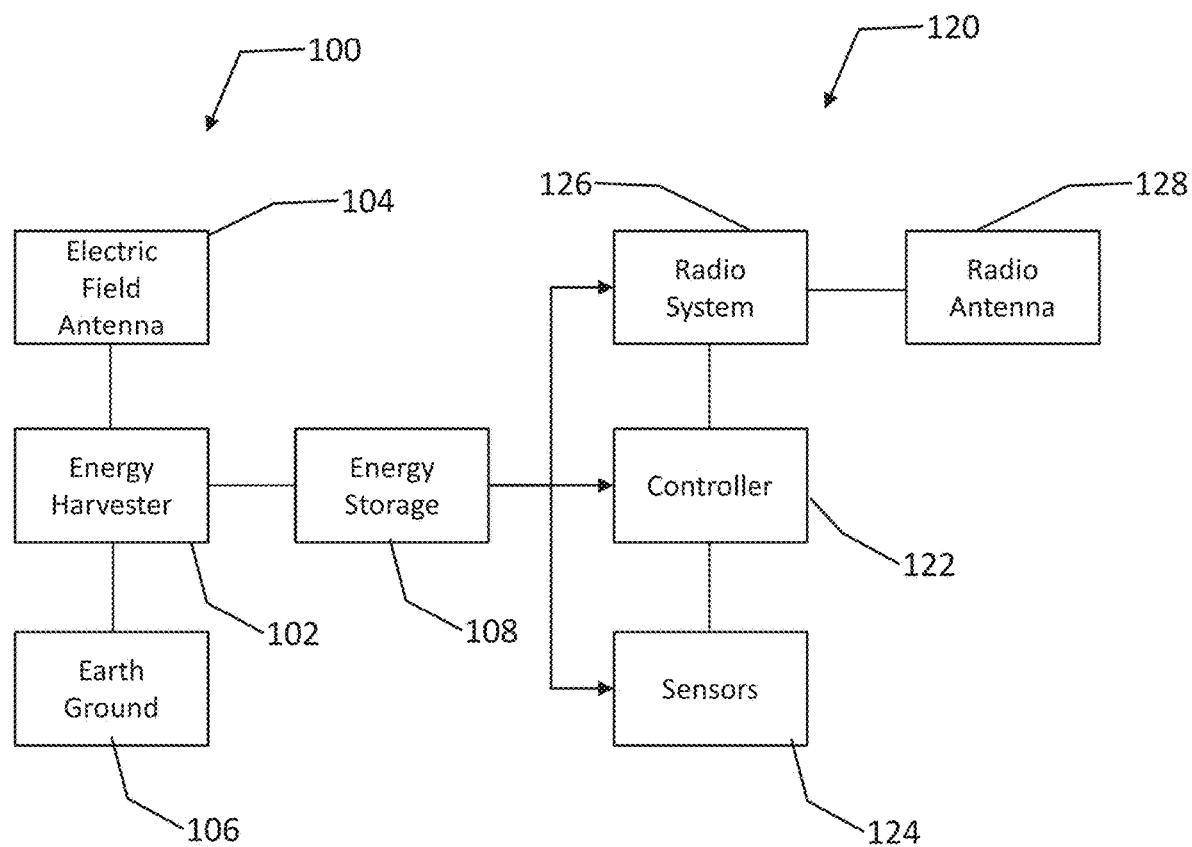
FIG. 1 is a block diagram of a monitoring system for a power line structure according to an implementation.

As already noted, past efforts to provide low cost and reduced maintenance monitoring of utility power poles and structures have often been less effective than desired. As will be appreciated from this disclosure, aspects of the disclosed technology effectively address the long-felt desire for survivable, very low maintenance, easily installed systems with convenient operational power systems that seemingly generate operational power freely "from the air;" in other words, generate operational power from stray electric field lines emanating from nearby high voltage power lines. Various implementations of the disclosed technology incorporate aspects of this energy harvesting to provide desirable and advantageous features, that in some cases have been impractical to include in similar systems before now. As just a few examples, in some cases implementations include sensor features like detecting flash (e.g., arcing) or EMP (electromagnetic pulse), environmental conditions like temperature and other weather, and even camera and emergency "Blue phone" features.

These and other features are made possible in various implementations of the disclosed technology, making these aspects both unique and feasible for mass implementation. In various cases, the disclosed technology enables implementations of sensing and monitoring features that in the past were considered infeasible due to the drawbacks of other operational power systems, such as using magnetic fields, solar cells or replaceable batteries. The disclosed technology powers those previously dreamt of features and makes them a reality. As will be appreciated, aspects of this disclosure describe practical ways to provide operational power to remote sensing devices in a simple, wireless, and robust manner without the need to closely approach and/or contact live high-voltage power lines. Further, in various implementations, methods of extracting power from stray electric fields may be applied for other applications in similar close proximity to power line structures.

Various implementations of the disclosed technology provide devices and systems that predict failure and remotely inform of deleterious events to power/utility poles and/or power lines without the use of solar cells, replaceable batteries, or direct connections to the power lines themselves. The disclosed technology enables sensing and monitoring devices to uniquely capture energy from electric fields by proximity to the power lines to harvest small but sufficient energy to power internal sensors and transmission circuits. Accordingly, while others have identified a need for power pole monitoring and elaborated the benefits of monitoring, implementations such as those disclosed herein advance the state of the art with working hardware and methods for operating devices in a practical, cost enabling method, without the drawbacks of previous expensive attempts or proposals based on magnetic fields, solar, replaceable batteries or close/intimate contact with high voltage lines.

Various examples of monitoring, sensing, and/or energy harvesting implementations provide one or more benefits and/or features. In some cases the cost of installation is low. Various implementations lack large batteries, ruggedized solar cells and/or large coils of copper wire often used by existing designs approaches. In some cases, a simple metal or metalized box carries and protects system electronics while also uniquely serving as a power gathering antenna. In various implementations, system electronics sit in a non-conductive container, such as a plastic tube, that also contains a metalized interior acting as its power source antenna. In some cases an energy harvesting system includes a long rod as a power source antenna.

Various implementations require little to no maintenance due to the lack of replaceable batteries and solar cells that may need cleaning or replacement. Certain implementations include an enclosure that provides a substantial Faraday shield effect, which largely immunizes the system to lightning strikes. Further, capturing sufficient operational power from power line electric fields avoids the need for complex, expensive magnetic wire coils that include thousands of copper wire turns in order to cover a large loop area.

Various implementations provide monitoring systems for a power line structure, methods for monitoring a condition near a power line structure, and/or an apparatus capable of extracting power near high tension power lines. These implementations and other implementations of the disclosed electric field energy capture can enable one or more advanced features, including one or more of the following features.

Flash Detection—Various implementations can employ sensor(s) and a controller configured to detect a bright flash from arcing power lines at some distance from the sensor(s).

EMP Detection—Various implementations can include sensor(s) and a controller configured to detect spikes and/or other variations in the electric field caused by arcing power lines or an external electromagnetic pulse (EMP) event.

Camera option—Various implementations can include a camera and a controller configured to use the camera to capture an image. For example, in some cases the controller receives data from one or more sensors indicating that an emergency situation has occurred. Examples of emergency situations can in some cases include Blue Phone usage or the detection of certain vibrations, flashes, or other conditions.

Emergency "Blue Phone" option—Various implementations can include a switch, such as a momentary switch, in an earth ground lead. Pressing the switch opens the ground connection, which can be detected by power sensors monitoring the power system. In some cases a controller is configured to generate and send a message and/or a photograph to a remote monitoring station in response.

Pole tilt and incident monitoring—Various implementations can include one or more vibrational and/or other movement sensors in communication with a controller. The controller can be configured to detect movement (both violent and incremental) of a utility pole or other structure based on the sensor data.

Temperature, pressure, wind, and/or other environmental monitoring—Various implementations include one or more environmental sensors and a controller configured to receive sensor data and determine one or more environmental conditions. In some cases the detection of environmental condition(s) can include tracking the condition (e.g., temperature) over time and/or across distance via a network of multiple sensing systems.

Long Distance Communication 10+ Mile range—Various implementations can include sensors and a controller configured to detect a condition based on sensor data and to then transmit a message to a remote monitoring station indicating the detected condition and location. For example, the controller transmission may include spatial coordinates (e.g., GPS coordinates) and/or power line structure tag or identification information.

Remote/Untrained System Installation—Various implementations include power structure monitoring systems that can be installed near, but not immediately close to, various power line poles without removing power from the line and without requiring personnel trained to work with high-voltage systems. In some cases energy harvesting systems and methods provided by the disclosed technology enable monitoring systems to be installed at various distances from high voltage lines. For example, various implementations enable successful installation at a safe distance from a high voltage power line as defined by OSHA 1926.1408 or other safety regulations. In such cases, the monitoring system may be installed not closer than, e.g., 10 feet for 50 kV lines, 15 feet for 50-200 kV lines, and so on. Table 1 below provides additional details about the minimum clearance distances specified in OSHA 1926.1408.

TABLE 1

OSHA 1926.1408 MINIMUM CLEARANCE DISTANCES

| Voltage (nominal, kV, alternating current) | Minimum clearance distance (feet) |
|---|---|
| up to 50 | 10 |
| over 50 to 200 | 15 |
| over 200 to 350 | 20 |
| over 350 to 500 | 25 |
| over 500 to 750 | 35 |
| over 750 to 1,000 | 45 |
| over 1,000 | (as established by the utility owner/operator or registered professional engineer who is a qualified person with respect to electrical power transmission and distribution). |

Note:
The value that follows "to" is up to and includes that value. For example, over 50 to 200 means up to and including 200 kV.

In certain cases, implementations of the disclosed technology can provide a system capable of extracting power from high tension power lines by means of electric fields emanating from the lines. The system uses that power for monitoring and other utilitarian purposes. In some cases the system includes a metal or metalized box fashioned as a Faraday shield with two small weather resistant perforations for a ground connection and a radio antenna. In some cases the metal or metalized box is weather tight or resistant and provisioned with lightning arrestors at the openings in order to tolerate extreme electrical disturbances.

Certain implementations include an insulated box or tube that provides lightning and weather resistance. The tube encloses an internal energy harvesting antenna and support electronics which may optionally be further enclosed in a metallic enclosure inside the insulated box or tube. In some cases the device or system includes an optimized energy harvesting circuit with an impedance tuned circuit, rectifier, energy storage and power conversion. A controller, such as a low power microprocessor, is included in order to manage timing, sensors and radio subsystems. In some cases the device or system includes sensor(s) that are accessible to the controller and/or a radio for long distance communication. In some cases the radio can be a cellular, IoT, or Long Range (LoRa) radio system. According to various implementations, monitoring systems and devices may be designed to monitor conditions near a utility power structure (e.g. pole), but may also be used near a utility power pole for any other suitable purpose requiring a safe and reliable source of operational power.

As discussed elsewhere, various implementations of the disclosed technology include a controller that is electrically coupled to a radio system and, optionally, one or more sensors. In some cases the controller is implemented in the form of a computer microprocessor, though it should be understood that other forms of controller circuits can be used. In some cases the controller is configured to perform particular operations or actions by virtue of having software, firmware, hardware, or a combination of them installed on the system that in operation causes or cause the system to perform desired actions. In some cases computer-executable instructions stored on a physical, tangible computer-readable medium are loaded by the controller to configure the controller to perform particular operations or actions. Examples include, but are not limited to, receiving and processing data from one or more sensors, detecting various conditions related to sensor data values, and generating and transmitting information with the radio.

Turning now to the drawings, FIG. 1 is a block diagram of a monitoring system for a power line structure according to an implementation. According to the depicted implementation, the system includes an electrical energy harvesting system 100 that includes an energy harvester 102 electrically coupled to an electric field antenna 104, an earth ground connection 106, and an energy storage component 108, which can be a rechargeable battery, super capacitor, etc. The harvesting system 100 is electrically coupled to and powers a sensor system 120 that includes a controller 122 electrically coupled to one or more sensors 124 and a radio system 126, which in turn is coupled to a radio antenna 128.

Figure 2:
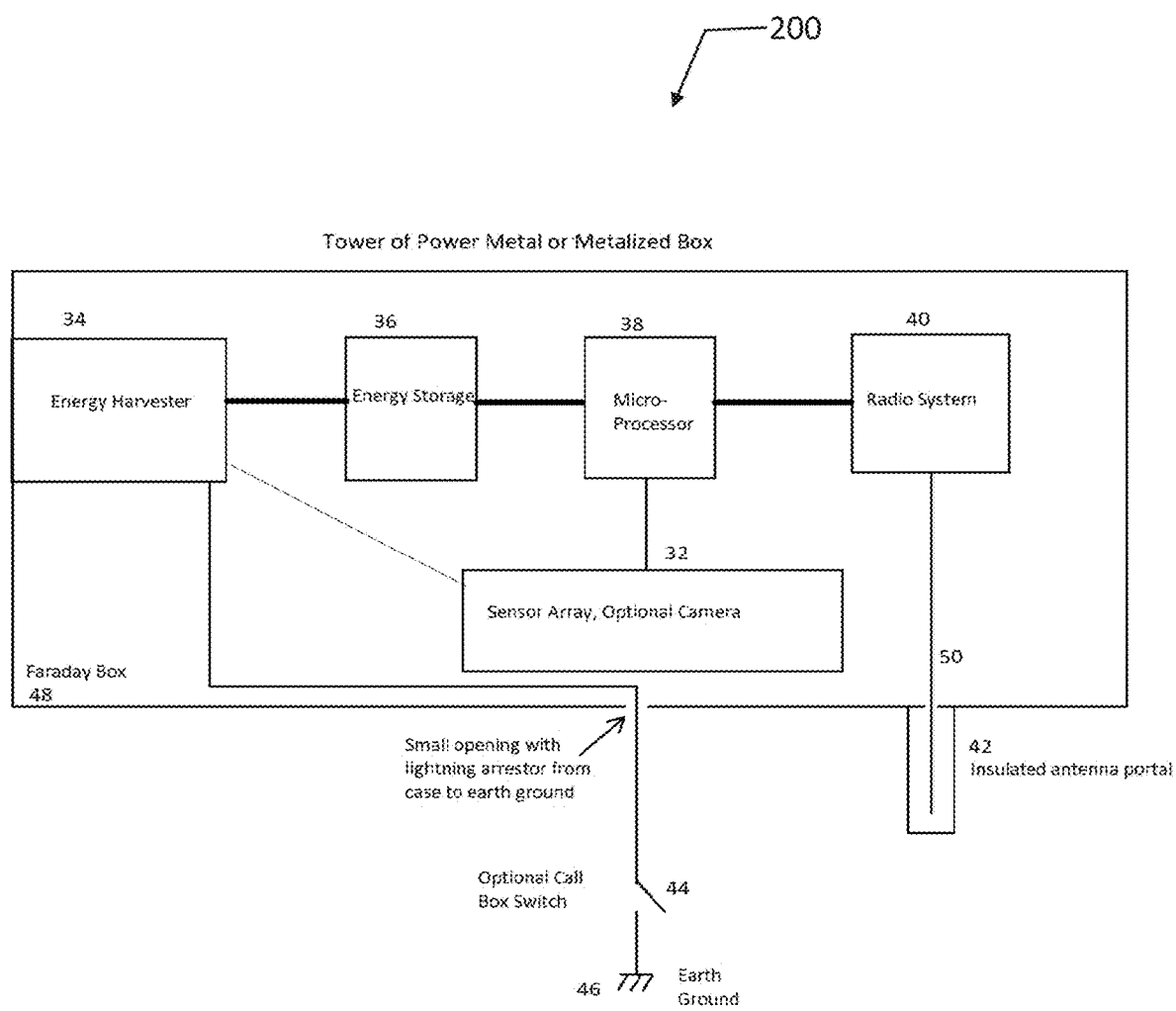
FIG. 2 is a block diagram of a monitoring system for a power line structure according to another implementation.
Figure 3:
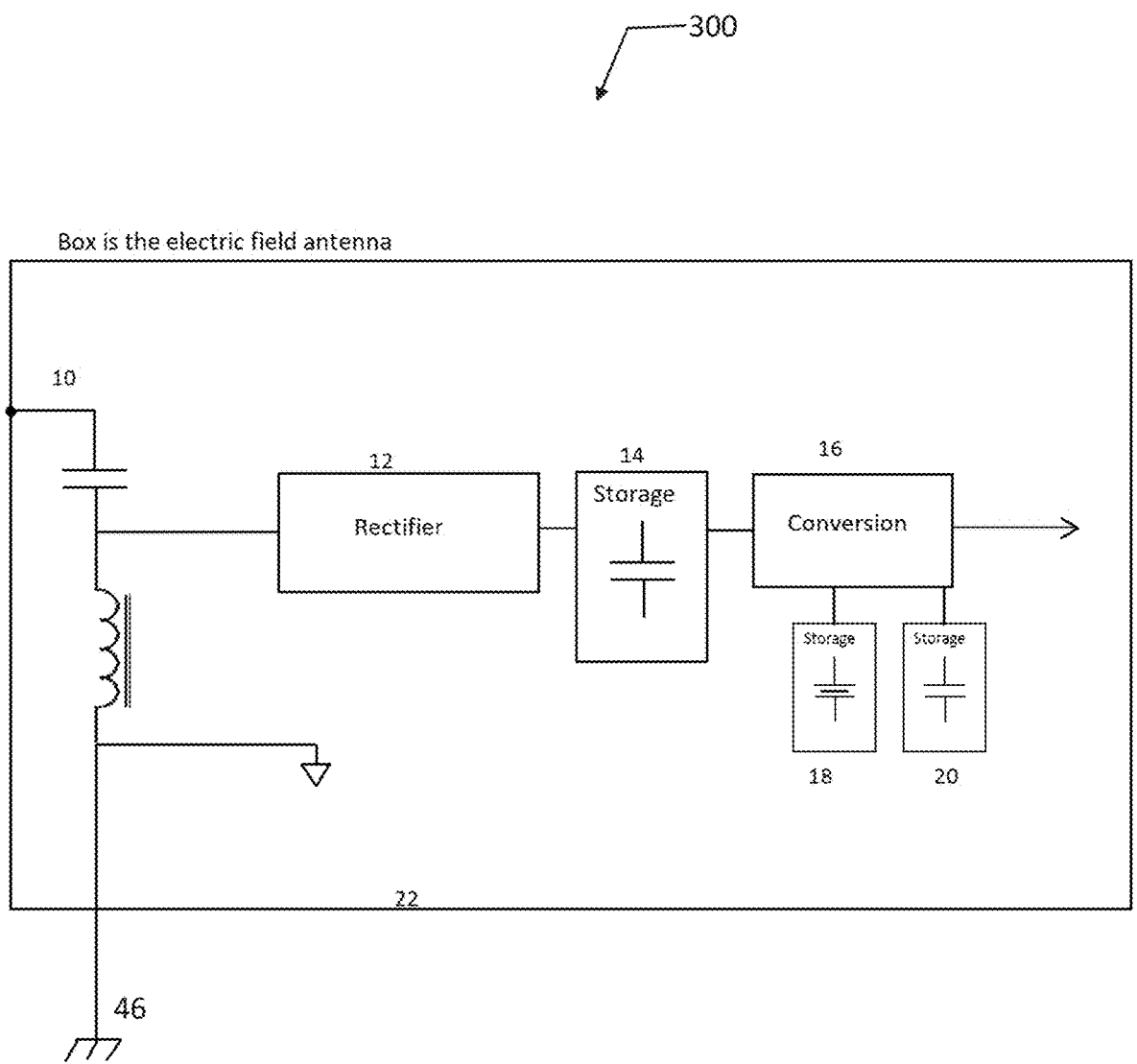
FIG. 3 is a block diagram of an electrical energy harvesting circuit according to an implementation.

FIG. 2 is a block diagram of a monitoring system 200 for a power line structure according to another implementation. FIG. 3 is a block diagram of an electrical energy harvesting circuit 300 according to an implementation. Referring to both FIGS. 2 and 3, the harvesting circuit 300 includes an optional impedance matching network 10 tuned to 50 or 60 Hz as is appropriate. This may be a separate circuit or incorporated into the rectifier section. The harvesting circuit 300 also includes a rectifier section 12, which in some cases may take the form of voltage doubler or a simple rectifier, depending on and optimized for the available electric field. The harvesting circuit also includes a local storage element 14, which is available to a power conversion stage 16. The power converter 16 is in some cases a high efficiency voltage conversion stage performing a buck or buck boost voltage conversion to, e.g., track the optimal power point dependent on the electric field strength. In some cases the conversion stage 16 stores energy in a local rechargeable battery 18 and/or a local Super Capacitor 20. In some cases this stored energy can be helpful for short term but higher power needs. For example, in some cases the controller 38, radio 40, and/or sensors and camera circuits 32 may require additional and higher power for operation.

According to various implementations, the monitoring system 200 includes an enclosure or container 48, which may be configured in any suitable shape. In various implementations the energy harvesting circuit 300 is also provided with its own enclosure 22.

Accordingly, in some cases one or both enclosures can provides a weather and/or lightning resistant enclosure for virtually unlimited life time. In some cases one or both enclosures are implemented as a metallic or metal enclosure. In such cases the enclosure acts as one plate of a virtual capacitor with the nearby power line forming the other plate. The enclosure then captures a part of the electric field emanating from the power line (e.g., at 50 or 60 Hz).

Figure 7:
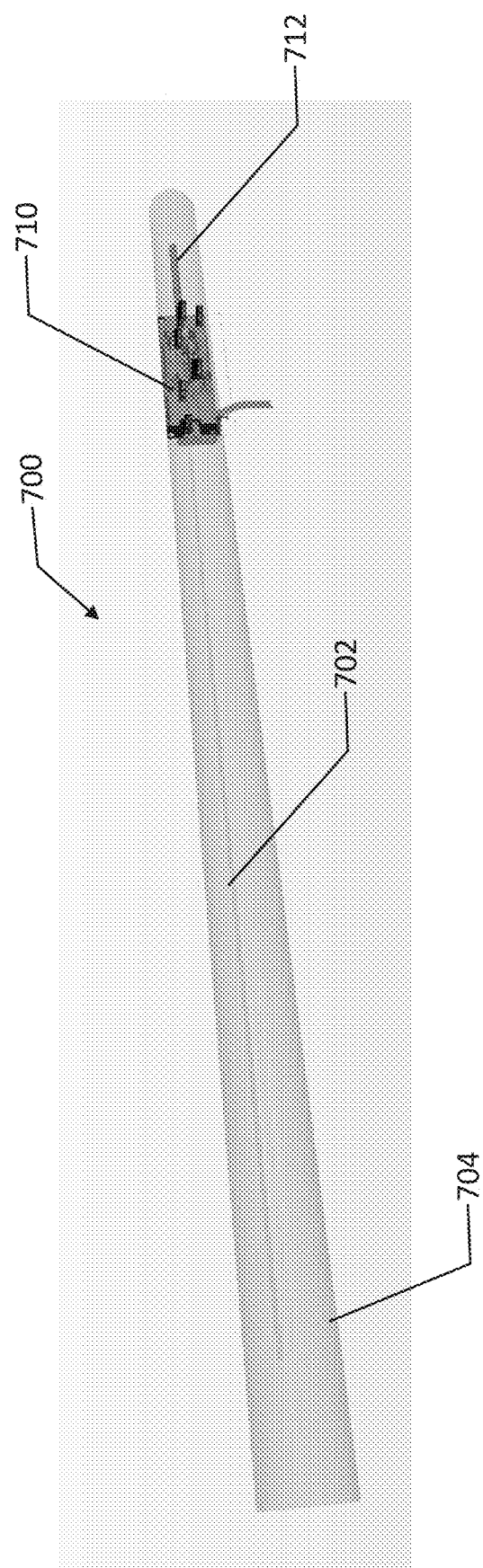
FIG. 7 is a depiction of a monitoring system including an electric field antenna mounted within an insulative tubular enclosure according to an implementation.

In certain implementations, one or both enclosures 22, 28 act as a Faraday cage with a carefully controlled ground point that allows for managing arc over in the event of lightning strike. in some cases one or both enclosures has an insulative exterior, such as in the case of a plastic tube (e.g., as shown in FIG. 7). In such cases the enclosure acts as an insulator to protect the interior power gathering antenna surface and enclosed electronics.

As shown in FIGS. 2 and 3, in certain cases suitable energy storage is provided in the form of rechargeable batteries, capacitors and/or Super Capacitors 36, 14, 18, 20 which can be helpful for providing stored energy for sustained needs and higher power transient demands.

The controller 38 is depicted as a low power microprocessor in the illustrated implementation. In some cases the controller 38 incorporates low energy sleep technology to reduce the power drawn during idle periods. As shown in FIG. 2, the radio 40 is electrically coupled to a radio antenna 50. In various implementations, the radio is a low power radio that may be Cellular based IOT or LoRa or employ a similar wireless communication protocol. The radio antenna 50 includes a portal 42 that penetrates the outer enclosure 48 in a survivable means not susceptible to the weather or lightning strike.

As depicted in FIG. 2, in some cases a monitoring system can include an optional "call box" emergency notification switch 44 that enables the system to send out an emergency message (e.g., S.O.S.) via its radio if activated. This has the possibility of making the entire power grid a distributed emergency response system for almost zero extra cost.

FIGS. 2 and 3 further depict a required earth ground connection 46. In some cases the earth ground connection includes a ground rod or a grounded guy wire. In some cases the monitoring electrical energy harvesting system includes an electrical "Earth ground" connector for connecting a grounded conductor or other ground connection to the harvesting system. In such cases the Earth ground connection is provided as an electrical connection. In some cases the Earth ground connection may be implemented as a capacitive coupling between the harvesting circuit and Earth ground. As an example, in some cases a metal plate connected to the system and dangling below the system can provide a ground reference through capacitive coupling to Earth.

Figure 4:
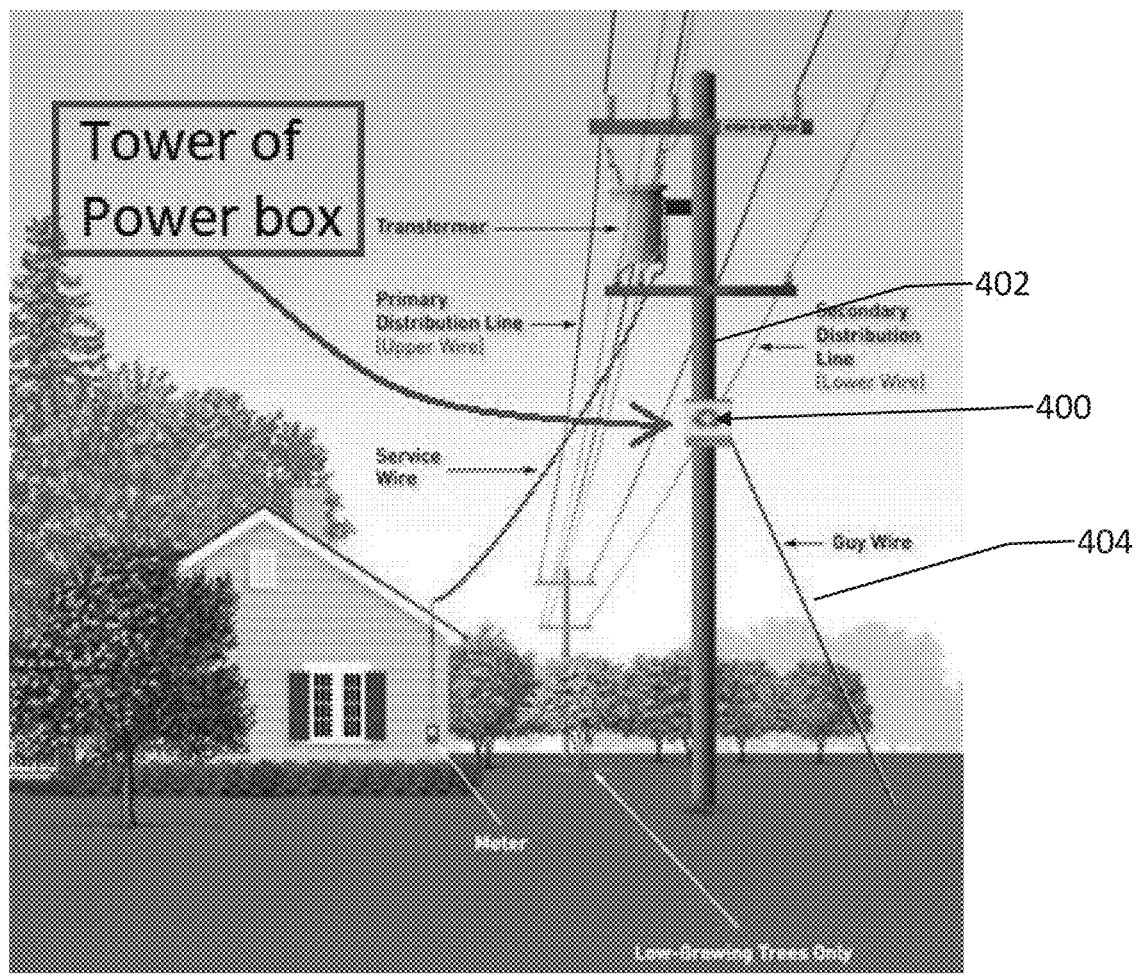
FIG. 4 is an illustration of a monitoring system mounted to a power line pole according to an implementation.

FIG. 4 is an illustration of a monitoring system 400 mounted to a power line pole 402 according to an implementation. A guy wire 404 provides an earth ground connection. In various implementations the monitoring system 400 may optionally be referred to as a "Tower of Power" box.

Figure 5:
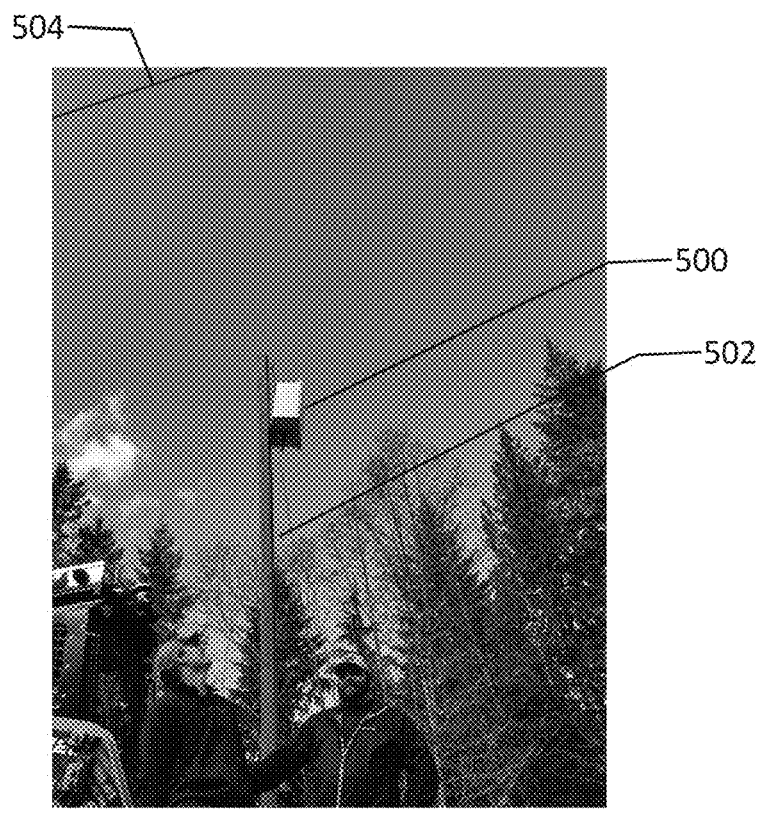
FIG. 5 is a depiction of a monitoring system mounted on a utility pole near a high tension power line pole according to an implementation.

FIG. 5 is a depiction of another monitoring system 500 mounted on a utility pole 502 near a high tension power line 504 according to an implementation.

Figure 6:
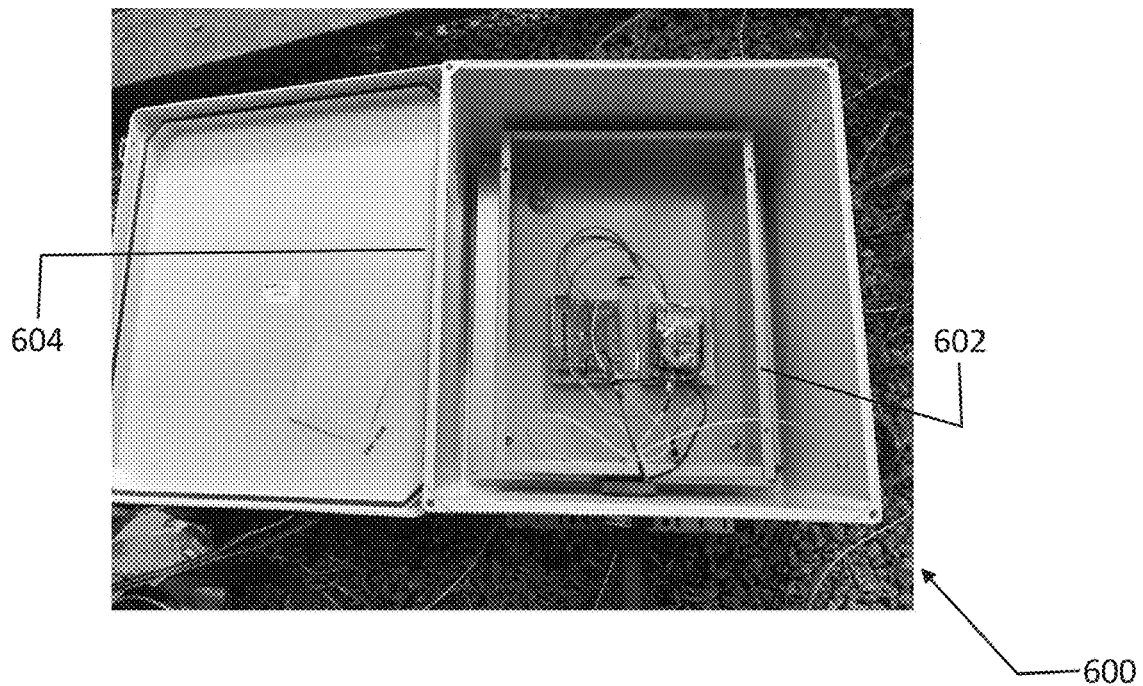
FIG. 6 is a depiction of a monitoring system including a conductive inner enclosure mounted within a weather resistant outer enclosure according to an implementation.

FIG. 6 is a depiction of a monitoring system 600 including a conductive inner enclosure 602 mounted within a weather resistant outer enclosure 604 according to an implementation.

FIG. 7 is a depiction of a monitoring system 700 including an electronics module 710 electrically coupled to an elongated electric field antenna 702 and a radio antenna 712 mounted within an insulative tubular enclosure 704 according to various implementations. The electronics module 710 includes an electrical energy harvesting system and a sensor system electrically coupled to the harvesting system. The harvesting system and sensor system can in some cases be implemented as described with respect to other examples herein.

The harvesting system and the sensor system are mounted to the electronics module 710 within the insulative tubular enclosure 704. As illustrated in FIG. 7, in various implementations the harvesting system and sensor system are directly mounted within the insulative tubular enclosure 704 without the use of a metal enclosure. In the depicted example, the electric field antenna 702 is provided in the form of an elongated conductive rod. In some cases the electric field antenna 702 is provided in the form of a longer conductive wire that extends through the tube 704.

Although not shown, it is also contemplated that in some cases the electronics module 710, the harvesting system and/or the sensor system are further mounted within a metal or metallized enclosure, which itself is mounted within the electrically insulative tubular enclosure 704. In such cases the conductive metal/metallized enclosure can be optionally employed as the electric field antenna.

To validate proof of concept, an experimental test of various aspects of an implementation was conducted. Power and voltage were measured and charted as shown below:

Capacitive coupled measurements—Using a medium voltage line (likely 48 kV) about 35 feet high as a test bed and a large sheet of metal—about 4' sq held about 5' off the ground, with one lead in the ground.

Figure 8:
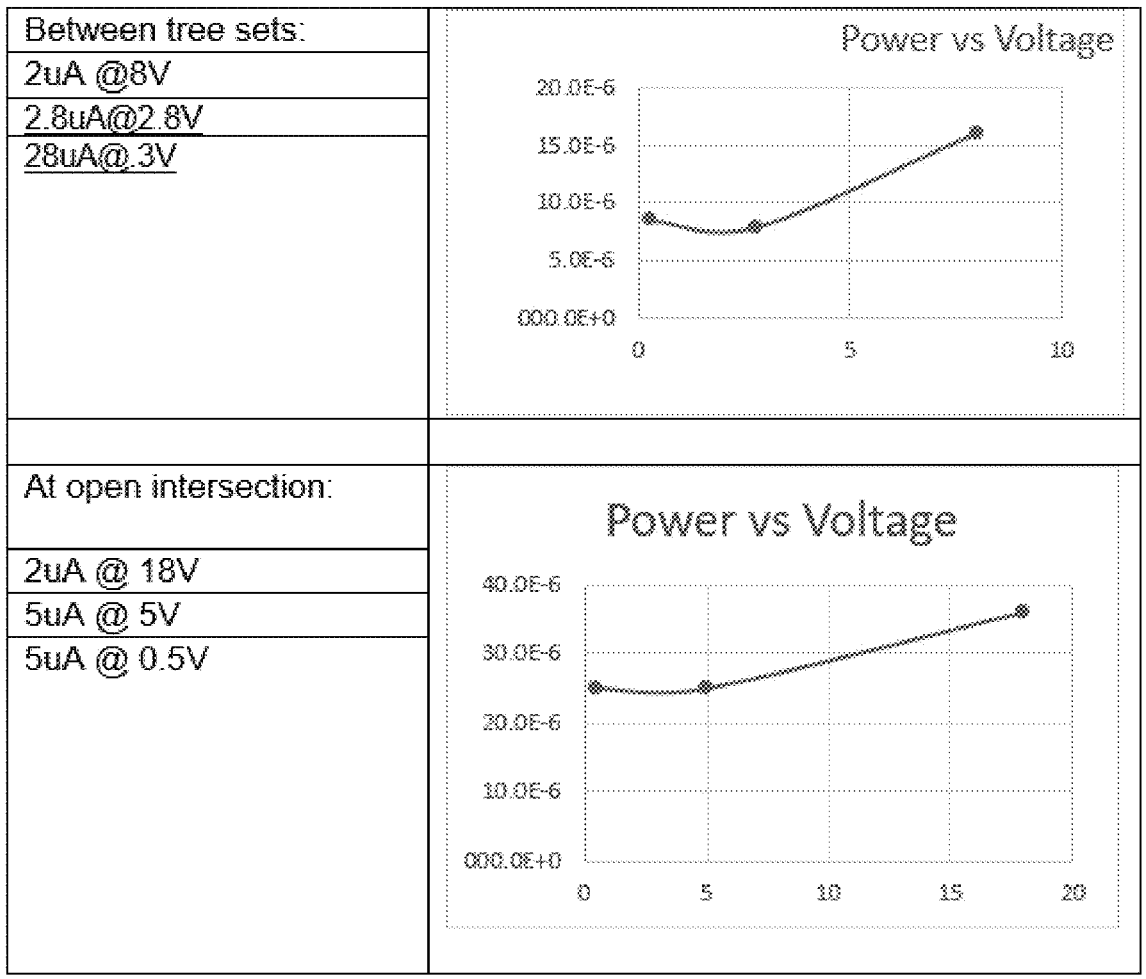
FIG. 8 includes charts depicting measured power and voltage according to an experimental test of various aspects of an implementation.

Open Circuit Test
- Open circuit voltages of 2 to 25V were obtained.
- The variability was directly related to nearby foliage that had a big shielding effect.
- No significant effect was observed regarding vertical vs horizontally stacked power lines (delta configured)
- The sheet had about the same effect as touching with the hand
- A metal ruler was also effective but not as great as the larger sheet.
- Open circuit voltages were directly proportional to distance above ground Power measurements—Power measurements were then conducted searching for the maximum power point in crude but demonstrative steps. Measurements between tree sets and at an open intersection are illustrated in FIG. 8.

Experimental Conclusion—These few measurements show that this apparatus can extract power at reasonable voltages and considerable distance from the lines. Since voltage was shown to be related to proximal distance that for each halving of distance a 4 fold increase in power could be obtained. With only the 5' height from ground, it could be shown that a radio transmission every few 10s of minutes would be possible.

Additional measurements were taken from a monitoring system deployed at various heights with respect to a power line. Results were as follows:

Radio Usage Calculations—The radio uses the lion's share of power for the system.

|  | Per usage | | | | |
| --- | --- | --- | --- | --- | --- |
|  | RadioOntime(Sec) | Radio-MCUVoltage | Current Usage mA | RadioPower(W) | RadioEnergy |
| 48 KV powerlines 3 phase | 0.01 | 2.5 Continuous | 40 | 0.1 | 0.001 |
| Est Antenna Height from ground | PowerHarvester(W) | EffHarvester | EffectiveHarvest(W) | | Seconds to Balance |
| 15 | 15.0E−6 | 0.7 | 10.5E−6 | | 95.2 |
| 18 | 30.0E−6 | 1.7 | 51.0E−6 | | 19.6 |
| 19 | 45.0E−6 | 1.7 | 76.5E−6 | | 13.1 |
| 20 | 60.0E−6 | 1.7 | 102.0E−6 | | 9.8 |
| 21 | 75.0E−6 | 1.7 | 127.5E−6 | | 7.8 |
| 22 | 90.0E−6 | 1.7 | 153.0E−6 | | 6.5 |

Bottom Line for typical case—This shows that a transmission could take place about every 10 to 100 seconds based on height and system voltages. The safe distance to a power line without demanding line qualified personnel is defined by OSHA as a function of line voltage. The higher the voltage the greater the distance for objects and personnel. But this tracts field intensity roughly so regardless the Line voltage one can always get to a field intensity in the useful range validated by these measurements.

Although the disclosure has been described with reference to certain implementations and embodiments, persons skilled in the art will recognize that changes may be made in form and detail without departing from the spirit and scope of the disclosed apparatus, systems and methods.

What is claimed is:

1. A monitoring system for a power line support structure, comprising:
   a weather resistant enclosure configured to be mounted near to or on a power line support structure without contacting any power line supported by the support structure;
   an electrical energy harvesting circuit mounted within the weather resistant enclosure, the harvesting circuit configured to produce operational power and comprising a rectifier electrically coupled to a power converter;
   an electric field antenna electrically coupled to the harvesting circuit, the electric field antenna configured to receive electric fields emanating from one or more power lines supported by the support structure;
   an energy storage device mounted within the weather resistant enclosure and electrically coupled to the harvesting circuit for storing the operational power supplied by the harvesting circuit;
   an earth ground connection electrically coupled to the harvesting circuit for electrically or capacitively coupling the harvesting circuit to earth ground;
   a controller mounted within the weather resistant enclosure and electrically coupled to the energy storage device;
   a radio mounted within the weather resistant enclosure and electrically coupled to the energy storage device and the controller, the radio configured to transmit data from the controller; and
   a radio antenna electrically coupled to the radio;
   wherein the controller and the radio are powered by the operational power supplied by the harvesting circuit and/or stored by the energy storage device.

2. The monitoring system of claim 1, wherein the earth ground connection is configured to electrically couple the harvesting circuit to a guy wire.

3. The monitoring system of claim 1, further comprising a lightning arrestor electrically coupled between the electric field antenna and the earth ground connection.

4. The monitoring system of claim 1, wherein the power converter comprises a voltage conversion stage.

5. The monitoring system of claim 1, wherein the controller is configured to detect one or more of arcing power lines and an electromagnetic pulse based on the electric fields received by the electric field antenna.

6. The monitoring system of claim 1, further comprising one or more sensors electrically coupled to the controller and the harvesting circuit and/or the energy storage device, wherein the controller is configured to receive data from the one or more sensors, and wherein the controller is configured to detect power line conditions, detect temperature, detect movement of the power line support structure, and/or capture an image based on the data from the one or more sensors; and
  wherein the one or more sensors are powered by the operational power supplied by the harvesting circuit and/or stored by the energy storage device.

7. The monitoring system of claim 1, further comprising an emergency switch electrically coupled to and configured to open the earth ground connection, wherein the controller is configured to detect the open earth ground connection and transmit an emergency message to a remote monitoring station with the radio.

8. The monitoring system of claim 1, wherein the weather resistant enclosure comprises an electrically conductive layer that forms at least part of the electric field antenna.

9. The monitoring system of claim 8, wherein the weather resistant enclosure comprises a metal or metallized enclosure.

10. The monitoring system of claim 1, wherein the weather resistant enclosure is electrically insulative and the electric field antenna is mounted within the weather resistant enclosure.

11. The monitoring system of claim 10, further comprising an electrically conductive enclosure mounted within the weather resistant enclosure, wherein the electrical energy harvesting circuit, the energy storage device, the controller, and the radio are mounted within the electrically conductive enclosure.

12. A monitoring system for a power line support structure, comprising:
  a weather resistant enclosure configured to be mounted near a power line without contacting the power line;
  an electrical energy harvesting system, comprising:
    an electric field antenna configured to receive electric fields emanating from the power line;
    an electrical energy harvesting circuit mounted within the enclosure and electrically coupled to the electric field antenna, the harvesting circuit configured to produce operational power and comprising a rectifier electrically coupled to a power converter;
    an earth ground connection configured to electrically couple the harvesting circuit to earth ground by direct connection or via a capacitive structure; and
    an energy storage device electrically coupled to the harvesting circuit; and
  a sensor system electrically coupled to and powered by the harvesting system, the sensor system configured to sense a condition and transmit corresponding condition data.

13. The monitoring system of claim 12, wherein the sensor system comprises one or more sensors electrically coupled with a controller, and a radio and radio antenna electrically coupled with the controller.

14. The monitoring system of claim 13, wherein the controller is configured to detect one or more of arcing power lines and an electromagnetic pulse based on the electric fields received by the electric field antenna.

15. The monitoring system of claim 13, wherein the controller is configured to receive data from the one or more sensors, and wherein the controller is configured to detect power line conditions, detect temperature, detect movement of the power line structure, and/or capture an image based on the data from the one or more sensors.

16. The monitoring system of claim 12, wherein the electric field antenna comprises an electrically conductive layer of the weather resistant enclosure.

17. The monitoring system of claim 16, wherein the weather resistant enclosure comprises a metal or metallized enclosure.

18. The monitoring system of claim 12, wherein the weather resistant enclosure is electrically insulative and the electric field antenna is mounted within the weather resistant enclosure.

19. The monitoring system of claim 18, further comprising an electrically conductive enclosure mounted within the weather resistant enclosure, wherein the electrical energy harvesting circuit and the energy storage device are mounted within the electrically conductive enclosure.

\* \* \* \* \*